United States Patent [19]

Bacuvier

[11] Patent Number: 4,812,893
[45] Date of Patent: Mar. 14, 1989

[54] TRIAC DESENSITIZED WITH RESPECT TO RE-STRIKING RISKS ON SWITCHING ACROSS A REACTIVE LOAD

[75] Inventor: Pierre Bacuvier, Luynes, France

[73] Assignee: SGS-Thomson Microelectronics S.A., Gentilly, France

[21] Appl. No.: 43,557

[22] PCT Filed: Jul. 4, 1986

[86] PCT No.: PCT/FR86/00238
§ 371 Date: Mar. 18, 1987
§ 102(e) Date: Mar. 18, 1987

[87] PCT Pub. No.: WO87/00971
PCT Pub. Date: Feb. 12, 1987

[30] Foreign Application Priority Data

Jul. 30, 1985 [FR] France ................ 85 11642

[51] Int. Cl.$^4$ ........................................ H01L 29/747
[52] U.S. Cl. .............................. 357/39; 357/20; 357/86
[58] Field of Search ............... 357/20, 38, 39, 86

[56] References Cited

U.S. PATENT DOCUMENTS

| | | | |
|---|---|---|---|
| 3,711,325 | 1/1973 | Hentzschel | 357/39 |
| 3,879,744 | 4/1975 | Dumas | 357/39 |
| 3,964,091 | 6/1976 | Bernoes et al. | 357/39 |
| 4,611,128 | 9/1986 | Patalong | 357/39 |

FOREIGN PATENT DOCUMENTS 60-247970 12/1985 Japan .................. 357/39

Primary Examiner—Joseph E. Clawson, Jr.
Attorney, Agent, or Firm—Oblon, Fisher, Spivak, McClelland & Maier

[57] ABSTRACT

The invention provides a triac whose resistance to untimely striking in the presence of steep voltage fronts is increased. For this, a part of the gate electrode is provided above a five layer structure, a part above a four layer structure and finally a small part above a three layer structure.

4 Claims, 4 Drawing Sheets

TRIAC DESENSITIZED WITH RESPECT TO RE-STRIKING RISKS ON SWITCHING ACROSS A REACTIVE LOAD

BACKGROUND OF THE INVENTION

1. Field of the Invention

The invention relates to triacs.

Triacs are semiconductor components having two main electrodes and a control electrode (gate), this latter allowing the triac to be enabled so that current can pass between the main electrodes.

2. Description of the Prior Art

When the triac has been enabled by an appropriate pulse on its gate, it remains conducting until a zero cross over of the current which flows between its main electrodes, then it is disabled and should theoretically only be enabled again when a new pulse arrives on its gate.

The zero cross overs of the current between the main electrodes are imposed by the circuit external to the triac. In particular, triacs are used in circuits fed with alternating power, so as to control loads which may be either completely resistive or more or less inductive or capacitive. The control of more or less inductive loads is very frequent since it is met with particularly in the control of motors.

When the load is inducted, there is a phase delay between the current which flows through the load and the supply voltage at the terminals of this load. The result is that at the time of zero cross over of the current in the triac, the voltage at the terminals of the load is non zero (whereas it would be so with a purely resistive load).

Not only is this voltage not zero but it may be an appreciable fraction of the supply voltage.

Now, when the triac is disabled under the effect of cancellation of the current which flows through it, it acquires a very high impedance which means that substantially the whole of the supply voltage is to be found abruptly at the terminals of the triac and no longer at the terminals of the load.

There is then, at the time of disabling of the triac, a very rapid growth of the voltage at the terminals of the triac, which voltage passes in a very short time from 0 to a considerable fraction of the supply voltage. It is known that this very rapid growth may cause the triac to strike, that is to say untimely re-enabling (which will last until the next cancelling of the current in the load). This striking, called dV/dt striking is quite undesirable since the triac should only be re-enabled by gate pulses at well controlled times.

This phenomenon is all the more troublesome that dV/dt re-striking after a conduction phase seems to occur for a value of dV/dt (time growth gradient of the voltage) appreciably lower than the value which the triac would withstand if an attempt were made to cause dV/dt striking thereof without a previous conduction phase. In the presence of a previous conduction phase, the resistance of the components to such undesirable re-striking is called "dV/dt resistance to switching on opening";

It is therefore desirable to construct triacs which are insensitive to re-enabling by dV/dt striking on switching.

However, it is desirable for these triacs to be sensitive to a control provided by a low gate current.

These two requirements result in contradictory design constraints, all the more so since in general it is desirable to obtain triacs which are sufficiently sensitive whatever the polarities of the voltages at the terminals of the different electrodes of the triac.

It is recalled in this connection that the triggering of a triac is achieved in four distinct modes which are the following, in which a main electrode A1 is taken as potential reference, and the potential V2 of the other main electrode A2 and the potential Vg of the gate G are examined:
- triggering in the first quadrant: V2 positive, Vg positive, triggering in the second quadrant:
- V2 positive, Vg negative, triggering in the third quadrant:
- V2 negative, Vg negative, triggering in the fourth quadrant:
- V2 negative, Vg positive.

Obtaining sufficient sensitivity for gate triggering in these four quadrants results in particular configurations of the different doped zones and metal electrodes which form the internal structure of the triac.

Prior Art FIGS. 1 to 3 shows a normal triac configuration with so called central gate.

To explain this structure, a cross section of the structure has been shown first of all in FIG. 1 then in FIG. 2 a top view showing the cutting up of the doped zones (spotted zones of type N or non spotted zones of type P, surrounded by fine lines) and cutting up of the electrodes A1 and G (hatched zones surrounded by thick lines), and finally in FIG. 3 a bottom view also showing cutting up of the doped zones and the lower electrode A2.

The doped semiconductor regions forming the triac are the regions N1, N2, N3, N4 of type N and P1, P2 of type P formed as a sandwich. In the figures, regions N are spotted so as to distinguish them from regions P which are not. In particular, in FIGS. 2 and 3 cutting up of zones N and P flush with the surface of the structure has been shown.

Region N2 is a central layer extending in the middle of the whole structure.

Region P1 covers the whole of region N2 on one side (upper face side).

Region P2 covers the whole of region N2 on the other side (lower face side).

Region N1 is formed at the surface of region P1 but substantially only in half of the structure (left hand half in the Figures); region N1 is flush with the semiconductor surface (upper face) where it exists. Region P1 is flush with the same surface where there is no region N1; in practice, small holes CC1 called emitter short circuits are formed in the region N1; these are holes through which region P1 rises to the surface in the zone where region N1 is generally present.

Region N3 is formed at the surface of region P2, substantially over a little more than half of the surface of the structure. Region N3 is flush with the surface (which forms the lower face) of the semiconductor structure where it is present. Region P2 is flush with the rest of the lower face. Emitter short circuit holes CC3 are distributed throughout the major part of region N3.

Region N4 is a small region equivalent to region N1, formed in the region P1 and flush with the same side as region N1 but located elsewhere and intended to be covered by the gate metallization. For a central gate triac, the region N4 is the center of the structure; for a corner gate triac it would be in a corner. In addition, region N4 is located in conventional triacs facing a portion or region N3 and more precisely facing a portion of zone N3 which does not have any short circuit holes CC3.

The metallization A2 covers substantially the whole of the rear face, namely the region N3 where it is present and region P2 over the rest of the surface.

The metallization A1 covers a large part of the front face, the remainder being covered by the gate metallization G, with a gap obviously provided between these metallizations so that there is no short circuit therebetween.

More precisely, metallization A1 covers the region N1 (including moreover the short circuit holes CC1 through which the region P1 rises to the surface) except for a small strip which is the portion of region N1 the closest to region N4. It also covers region P1 except for the small strip which is the portion of region P1 the closest to region N4.

Finally, the metallization G covers essentially the region N4 without extending over region P1 except in a small zone P'1 of region P1; this small zone P'1 covered by the metallization G is a zone which is placed apart from the major part of region P1 but which is not completely separated since it is connected thereto by a narrow strip P"1 of region P1 which is covered neither by the metallization A1 nor by the metallization G.

FIGS. 4 to 6, similar to Prior Art FIGS. 1 to 3, show the structure of a corner gate triac. The above description remains valid and the references of zones N to P are the same. It should be noted that FIG. 6 is not truly a bottom view; it is a reversed bottom view so that the facing zones correspond to each other. In other words, the corner at the bottom right of FIG. 5 is the gate zone which is opposite the bottom right corner of FIG. 5 (part of zone N3 without short circuit holes CC3). We may also say that FIG. 6 represents the lower face of the structure seen by transparency in the same direction as FIG. 5 (top view).

The triacs shown in FIGS. 1 to 6 have insufficient dV/dt resistance characteristics, more especially during application of abrupt voltage fronts after a conduction phase of the triac.

SUMMARY OF THE INVENTION

To improve this characteristic of dV/dt resistance to switching on opening, the present invention provides a triac whose construction differs from those which have been described above in that the region N3 extends under only a part of the gate electrode, the region P2 having a part flush with the surface facing another part of the gate electrode.

More precisely, the positions where region P2 is flush are situated both under the part P'1 of region P1 and under a part of region N4 (this part of region N4 being preferably the one which is the furthest away from region P1). The flush part of region P2 may be adjacent the major part of region P2 or else be formed of pin point risers of region P2 through the region N3 (short circuit holes).

The result is a triac structure such that the gate electrode comprises three zones, one being in line with a superimposition of five regions of alternate conductivity (N4, P1, N2, P2, N3), another in line with a superimposition of four regions of alternated conductivity types (N4, P1, N2, P2) and the third in line with a superimposition of three regions of alternate conductivity types (P'1, N2, P2).

A detailed definition of the invention would therefore be the following: the triac comprises a semiconductor structure having an upper face covered with a first main electrode and a gate electrode, and a lower face covered with a second main electrode, the structure including:

- a type N central layer (N2), a first P type layer (P1) covering the central layer on the upper face side,
- a second P type layer (P2) covering the central layer on the lower face side,
- a first N type region (N1) formed in a part of the first P layer and being flush with the upper face in this part whereas the first P layer is flush with the rest of the upper face, the first N type region being moreover pierced with small so called emitter short circuit holes (CC1) through which the firt P layer P1 rises and is flush with the upper surface.
- a second N type region (N4) formed in another part of the first P layer and being flush with the upper face in this other part.
- a third N type region (N3) formed in a part of the second P layer (P2) and flush with the lower face in this part whereas the second P layer is flush with the rest of the lower face, the third N type region being moreover pierced with small so called emitter short circuit holes (CC3) through which the second P layer comes flush with the lower face.
- the first main electrode (A1) covering substantially the whole of the first N type region, including the short circuit holes of this first region, and covering a major flush part of the first P type layer, but not covering the first N type region and the first P type region in the immediate vicinity of the second N type region (N 4);
- the gate electrode covering substantially the whole of the second N type region (N4) as well as a small flush part (P'1) of the first P type layer, this small part being spaced apart from the major flush part of the first P type layer and being connected to this major part by a small narrow flush portion of the first P type layer, this narrow portion surrounding the second N type region and not being covered by an electrode;
- in this structure, the gate electrode is partially in line with a flush part of the second P type layer (P2) and partially in line with a part of the third N type region (N3).

In particular, it will be provided for this flush part of the second P type layer to extend below the small flush part (P'1) of the first P type layer, which part, it will be remembered, is covered by the gate electrode.

It will also be preferably provided for a third N type region part which is in line with the gate electrode not to be pierced with short circuit holes whereas short circuit holes are spread out over the rest of the third region.

DESCRIPTION OF THE PREFERRED EMBODIMENT

Figure 2:
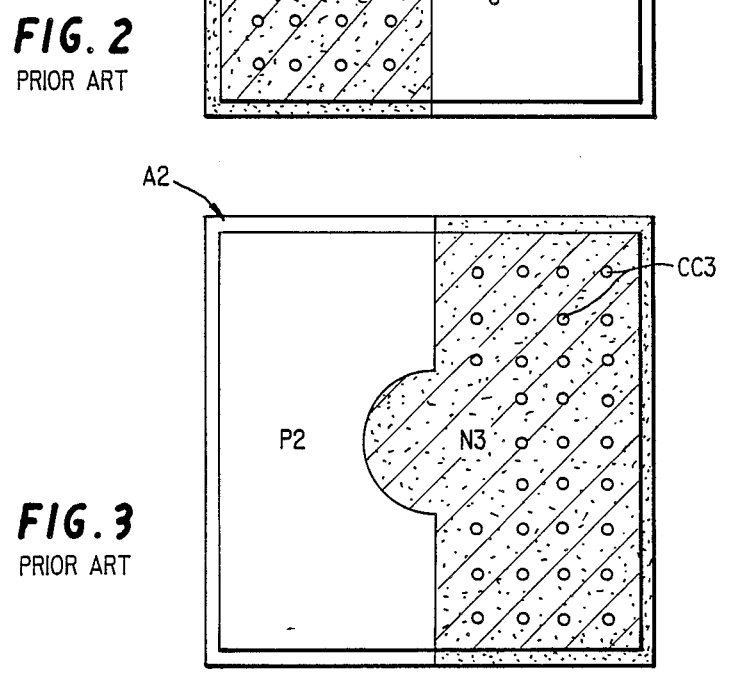
Figure 3:
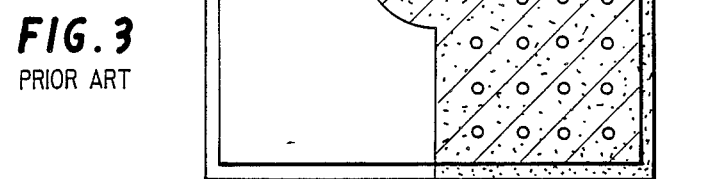
Figure 4:
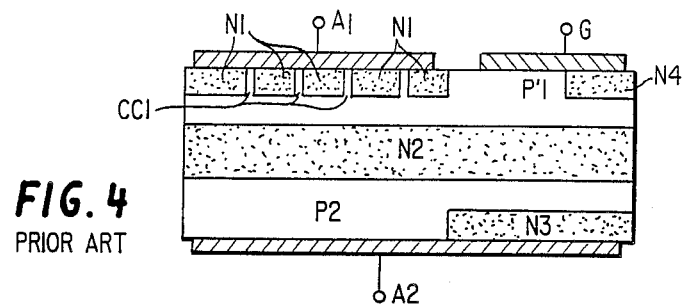
Figure 5:
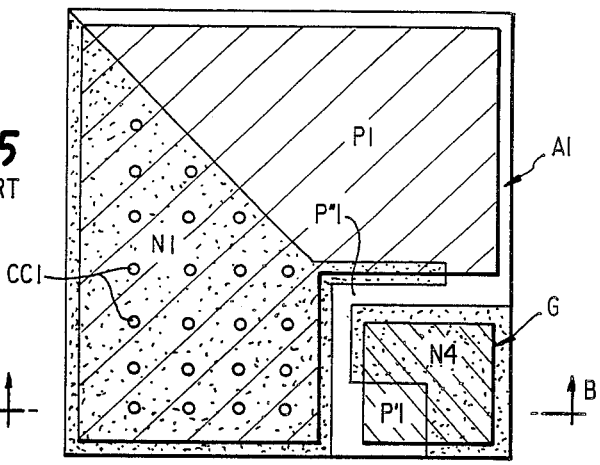
Figure 6:
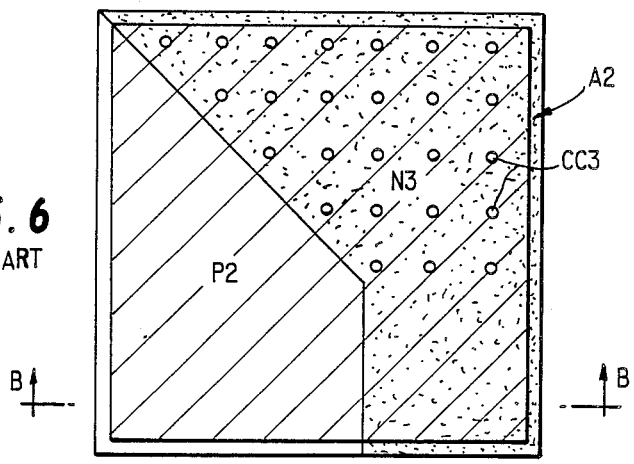
Figure 7:
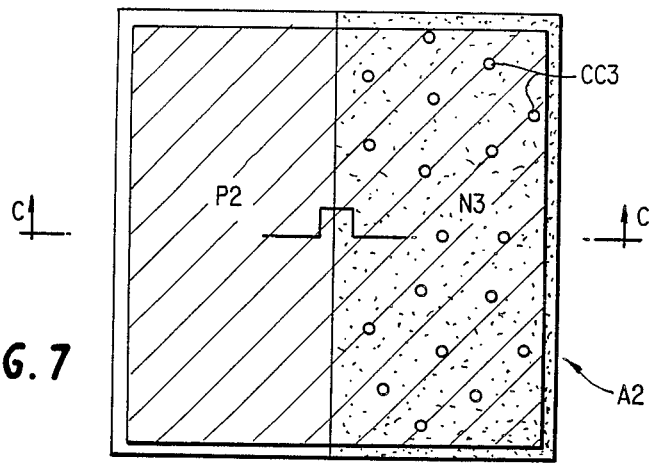
FIG. 7 shows a view of the lower face of a triac of the invention (central gate)
Figure 8:
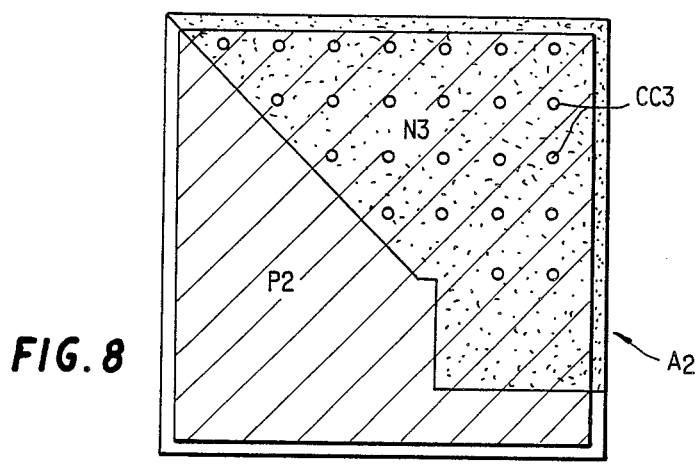
FIG. 8 shows a view of the lower face of a triac of the invention (corner gate)

FIG. 7 corresponds to the triac whose top view is shown in FIG. 2. FIG. 8 corresponds to the triac whose top view is shown in FIG. 5. The scales of the drawings are the same.

They clearly show the boundaries of zones P2 and N3 which form the invention.

In FIG. 7 it can be seen that the flush surfaces of regions P2 and N3 are practically identical, the terms "flush" or "flush with" for purposes of this specification indicate that a layer or portion of a layer is not covered by another semiconductor layer, the boundaries of these zones being formed by a line which passes through the center of the gate electrode.

By superimposing FIGS. 2 and 7 it can be clearly seen that the gate electrode G includes a half or substantially a half in line with region P2 and a half in line with region N3 and more precisely in line with a portion of region N3 without emitter short circuits.

Region P'1 in contact with the gate electrode is in line with region P2.

In practice, it can also be seen that a part of region N4 (the one which is closest to region N1) and a part P"1 of region P1 (narrow flush portion surrounding region N4, not covered by an electrode and connecting part P'1 to the major flush part of region P1) are also in line with region P2.

The same remarks apply to the case of a corner gate triac, which can be observed by superimposing FIGS. 5 and 8.

However, in the designed configuration, the narrow flush portion P"1 of type P (connecting the small zone P'1 to the major flush part of layer P1) is partially in line with region N3, the same moreover as a strip of region N4 which is immediately adjacent this narrow portion.

Figure 1:
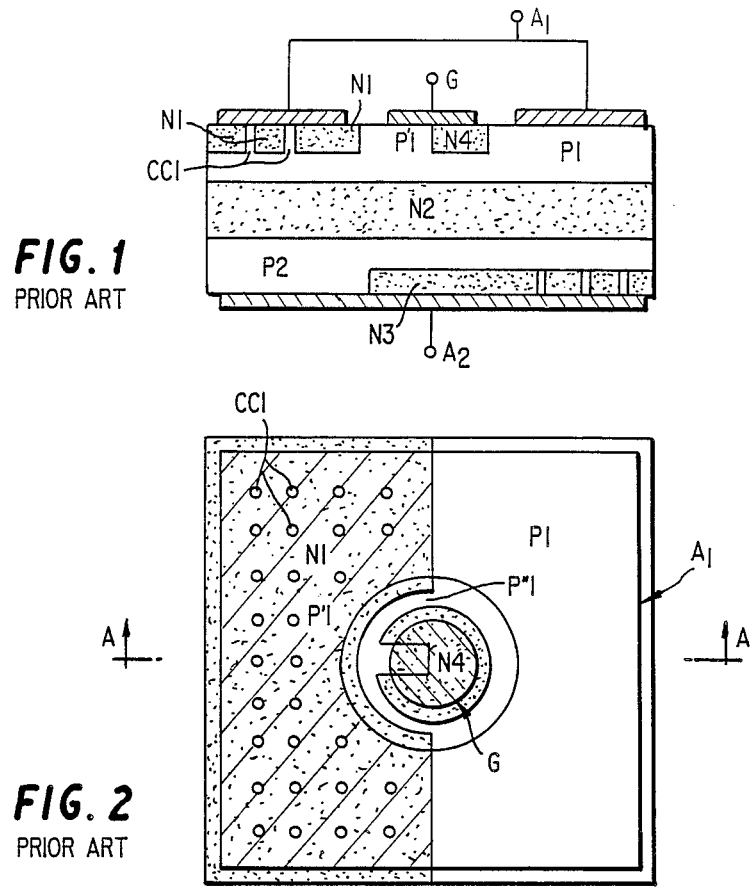
FIGS. 1 to 6 show the previously described prior art.
Figure 9:
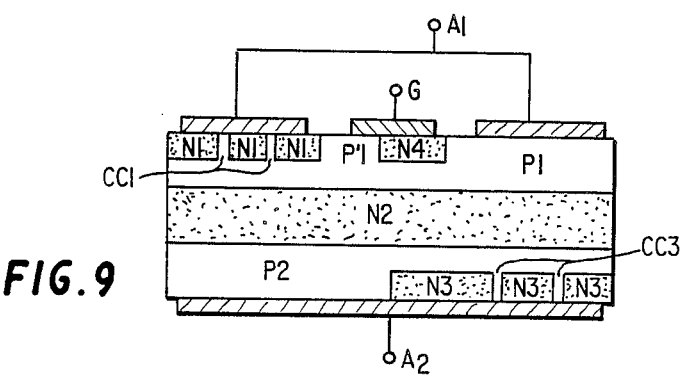
FIG. 9 shows a section of a triac in accordance with the invention.

FIG. 9 shows for completing the representation a section of a triac in accordance with the invention (here the central gate triac of FIG. 2; FIG. 9 should then be compared with FIG. 1), this section being made through the gate along a broken line CC shown in FIG. 7. This broken line CC is chosen so as to show the different superimpositions of regions which are in line with the gate.

It can be seen that the gate electrode G comprises a part in line with a superimposition of five layers of alternate conductivity types (N4, P1, N2, P2, N3), another part in line with a superimposition of four layers of alternate conductivity types (N4, P1, N2, P2) finally a part in line with the superimposition of three layers (P'1, N2, P2). In so far as the part in line with the five layers is concerned, it should be noted that the lower layer (N3) is a continuous layer, that is to say without short circuit holes.

Experience shows that the triacs thus formed behave particularly well in so far as the resistance to dV/dt striking on switching is concerned, without significantly affecting the sensitivity to triggering by a gate current in quadrants I, II, III.

It is desirable to provide for this type of triac control circuits causing triggering exclusively in the quadrants I, II and III which moreover raises no particular problem since triggering using the voltage of the AC mains may take place in quadrants I and III whereas triggering by means of an integrated control circuit may be provided in quadrants II and III.

Figure 10:
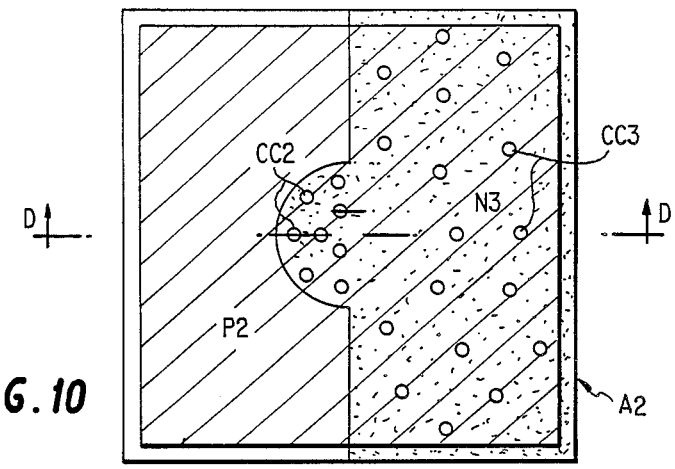
FIG. 10 shows a view of the lower face of another embodiment (central gate)
Figure 11:
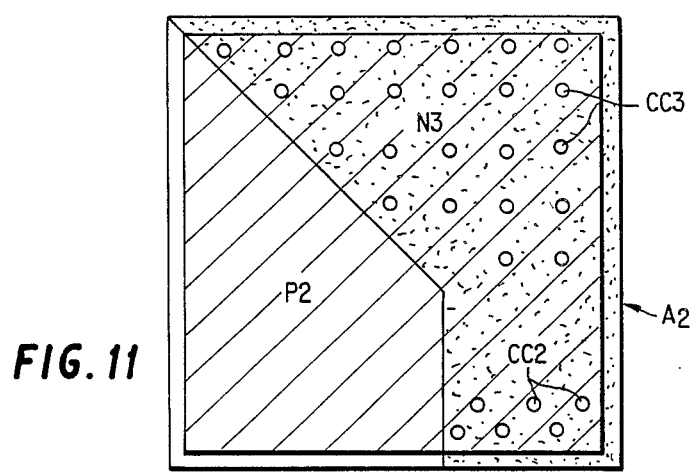
FIG. 11 shows a view of the lower face of another embodiment (corner gate) and FIG. 12 shows a section of a triac according to another embodiment (central gate)
Figure 12:
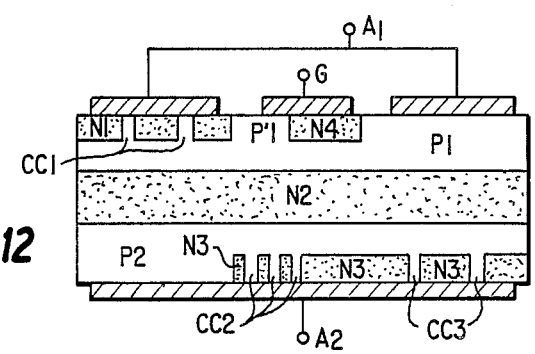

FIGS. 10, 11 and 12 similar respectively to Figures 7, 8 and 9 and having the same references show different embodiments in which the region P2 is flush with the surface in line with the gate electrode G not in the form of an extension of the major flush part or region P2 but in the form of short circuit holes CC2 through which region P2 rises to the surface through region N3.

These holes CC2 are spaced evenly apart at the position where the extension of region P2 is situated in FIGS. 7 to 9; more precisely, the gate electrode G comprises a first half or substantially a half which is in line with a portion of region N3 pierced with short circuit holes CC2, and a second line in line with another portion of region N3 not pierced with short circuit holes. The first half is the cone which covers the region P'1 and the portion of region N4 the furthest away from region P'1. The second half is the closest to region P1.

Like FIGS. 7 and 8, FIGS. 10 and 11 should be respectively superimposed on FIGS. 2 and 5. FIG. 12 is a section of FIG. 10 through line D—D.

What is claimed is:

1. A triac including a semiconductor structure having an upper face covered with a first main electrode and a gate electrode, and a lower face covered with a second main electrode, and further comprising:

a type N central layer having an upper face side and lower face side;

a first P type layer covering said central layer on said upper face side, a second P type layer covering said central layer on said lower face side, a first N type region formed in a part of the first P layer and being flush with the upper face in this part whereas the first P layer is flush with the rest of the upper face, the first N type region being pierced with emitter short circuit holes through which the first P layer rises and is flush with the upper surface, a second N type region formed in another part of the first P layer and being flush with the upper face in this other part, a third N type region formed in a part of the second P layer and flush with the lower face in this part whereas the second P layer is flush with the rest of the lower face, the third N type region being pierced with emitter short circuit holes through which the second P layer comes flush with the lower face, the first main electrode covering substantially the whole of the first N type region, including the short circuit holes of this first region, and covering a major flush part of the first P type layer, but not covering the first N type region and the first P type region in the immediate vicinity of the second N type region;

the gate electrode covering substantially the whole of the second N type region as well as a flush part of the first P type layer, this part being spaced apart from the major flush part of the first P type layer and being connected to this major part by a flush portion of the first P type layer, this portion surrounding the second N type region and not being covered by an electrode;

wherein, the gate electrode lies on top of three distinctive zones of superimposed semiconductor material;

the first zone is partially in line with said gate electrode and comprises said first P type layer whose said flush part interfaces said gate electrode, said type N central layer which interfaces and lies below said first P type layer, and said second P type layer which interfaces and lies below said type N central layer and whose flush part interfaces said second main electrode;

the second zone is partially in line with said gate electrode and comprises said second N type region whose flush part interfaces said gate electrode, said first P type layer which interfaces and lies below said second N type region, said type N central layer which interfaces and lies below said first P type layer, and said second P type layer which interfaces and lies below said type N central layer and whose flush part interfaces said second main electrode;

the third zone is partially in line with said gate electrode and comprises said second N type region whose flush part interfaces said gate electrode, said first P type layer which interfaces and lies below said second N type region, said type N central layer which interfaces and lies below said first P type layer, said second P type layer which interfaces and lies below said type N central layer, and said third N type region which interfaces and lies below said second P type layer and whose flush part interfaces said second main electrode.

2. The triac according to claim 1 wherein: the part of the third N type region which is in line with the gate electrode is absent short circuit holes whereas short circuit holes are distributed throughout the rest of the third region.

3. The triac according to claim 1 wherein: the flush part of the second P type layer which is in line with the gate electrode is formed by short circuit holes through which the second P type layer rises to the lower face through the third N type region, the gate electrode being moreover partially in line with a part of the third region absent short circuit holes.

4. The triac according to claim 1 wherein: the gate electrode part in line with the part of the third region absent said short circuit holes is the closest to the major flush part of the first P type layer, whereas the gate electrode part in line with said short circuit holes is the furthest away from the major flush part of the first P type layer.

* * * * *